United States Patent
Ting et al.

(10) Patent No.: US 6,638,849 B2
(45) Date of Patent: Oct. 28, 2003

(54) METHOD FOR MANUFACTURING SEMICONDUCTOR DEVICES HAVING COPPER INTERCONNECT AND LOW-K DIELECTRIC LAYER

(75) Inventors: Shao-Yu Ting, Hsinchu (TW); Jack Liang, Hsinchu (TW); Kuo-Ju Liu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 130 days.

(21) Appl. No.: 10/042,995

(22) Filed: Jan. 7, 2002

(65) Prior Publication Data

US 2002/0192937 A1 Dec. 19, 2002

Related U.S. Application Data

(60) Provisional application No. 60/294,875, filed on May 30, 2001.

(51) Int. Cl.$^7$ .......................................... H01L 21/4763
(52) U.S. Cl. ........................................ 438/618; 438/618
(58) Field of Search ............................. 438/618, 619, 438/633, 635, 637, 652, 677, 687, 624, 723

(56) References Cited

U.S. PATENT DOCUMENTS 6,566,258 B1 * 5/2003 Dixit et al. ................. 438/687
6,576,545 B1 * 6/2003 Hopper et al. .............. 438/624

* cited by examiner

Primary Examiner—Kamand Cuneo
Assistant Examiner—Monica D. Harrison
(74) Attorney, Agent, or Firm—W. Wayne Liauh

(57) ABSTRACT

A dual damascene process for forming semiconductor devices containing a copper interconnect and a low-K dielectric layer on a wafer which allows the copper interconnect to be formed subsequent to the formation of the low-K dielectric layer while preventing the low-K dielectric layer from being degraded by a subsequent plasma etching. The process includes the main steps of: (a) forming a silica glass layer on a wafer surface, which contains an inter-level dielectric (IDL) layer; (b) photolithographically patterning the silica glass layer according to the pattern intended for the copper interconnect; (c) conformably depositing a spacer dielectric layer on the silica glass layer; (d) anisotropically etching the spacer dielectric layer to form a sidewall spacer; (e) depositing a low-K dielectric material on the wafer to form a low-K dielectric layer, covering the silica glass layer and the sidewall spacer, followed by planarizing the low-dielectric layer by chemical-mechanical polishing; (f) photolithographically removing the silica glass layer to form a trench in the low-K dielectric layer; (g) depositing a copper layer to fill the trench; and (h) planarizing the copper layer.

18 Claims, 4 Drawing Sheets

METHOD FOR MANUFACTURING SEMICONDUCTOR DEVICES HAVING COPPER INTERCONNECT AND LOW-K DIELECTRIC LAYER

This application claims the benefit of Provisional Application No. 60/294,875, filed May 30, 2001.

FIELD OF THE INVENTION

The present invention relates to an improved process for fabricating semiconductor devices that contain a low-resistivity metal interconnect and a low-dielectric-constant dielectric layer. More specifically, the present invention relates to an improved process which protects the low-dielectric-constant (i.e., low-K) dielectric layer from being degraded by, for example, a plasma etching process, during the fabricating semiconductor devices that contain a copper or other low-resistivity metal interconnect embedded a low-dielectric-constant dielectric layer. The method of the present invention simplifies the copper based semiconductor device fabrication process by allowing the copper interconnect to be formed subsequent to the formation of the low-K dielectric layer without an extra dielectric pattern process. The method disclosed in the present invention is most advantageous in fabricating semiconductors involving the use of the conventional dual damascene process.

BACKGROUND OF THE INVENTION

The trend in the semiconductor industry is to use copper metal as interconnect material in the so-called damascene or dual damascene processes. Damascene is an interconnection fabrication process in which grooves are formed in an insulating layer which are then filled with metal to form the conductive lines that interconnect the component parts of the integrated circuit. Dual damascene is a multi-level interconnection process in which via openings, typically in the form of tungsten plugs, are formed in addition to forming the grooves of the single damascene process. Conductive lines, or the so-called "interconnects", are then deposited that interconnect the active and passive elements of the integrated circuit contained on the semiconductor chip.

Copper metal has been increasingly used as a replacement material for aluminum and aluminum-silicon alloys in VLSI and ULSI metallization to form the interconnections because it has better conductivity and is more reliable than other metals including the commonly used aluminum and aluminum alloys. However, one of the technical problems in using the copper metal is that copper atoms will still diffuse into silicon or other adjacent material(s) if applied directly to the silicon without first applying a barrier layer between the silicon layer and the copper layer. In conventional aluminum interconnect structures, the barrier layer is usually not required between the aluminum metal line and an $SiO_2$ inter-level dielectric (ILD). When copper is utilized, however, the copper metal must be encapsulated from the surrounding ILD, since copper atoms can easily diffuse into the adjoining dielectric. Once the copper reaches the silicon substrate, it will significantly degrade the device's performance.

Because copper encapsulation is a necessary step requiring a presence of a barrier material to separate the copper layer, other materials, such as a low-dielectric constant (low-K) material, can now be advantageously used as substitutes for the $SiO_2$ as the ILD material. A low-K material is defined as an dielectric material having a dielectric constant less than that of $SiO_2$, which has a dielectric constant of about 4. There are generally two types of low-K materials for semiconductor fabrication processes: (1) modified $SiO_2$ materials, such as fluorinated oxide (add limited F into $SiO_2$) and silsesquioxane (add limited H or C-based organic elements to $SiO_2$); and (2) organic materials, such as polyimides and polymers, having completely different molecular structures in comparison to $SiO_2$. Replacing the conventional $SiO_2$ material by a low-K material reduces the interline capacitance, thereby reducing the RC delay, cross-talk noise and power dissipation in the interconnect. One advantage of organic low-K materials is that they offer a lower dielectric constant than the modified $SiO_2$ materials.

Quite a few prior art references have extensively discussed the fabrication of semiconductor devices that contain copper interconnects and low-K dielectric layer. For example, U.S. Pat. No. 5,965,934 discloses a semiconductor device formed on a wafer comprising source and drain regions contacted by source and drain contacts, respectively. Each source and drain region is separated by a gate region contacted by a gate electrode, with a first level patterned interconnect contacting the source and drain contacts and the gate electrode in a predetermined pattern and with a second level patterned interconnect contacting the first level patterned interconnect by a plurality of metal lines.

The metal lines are separated by a first dielectric material, and the second level patterned interconnect comprises a low resistance metal wherein the low resistance metal is selected from the group consisting of copper, gold, silver, and platinum and separated by a planarized dielectric material inert to diffusion of the low resistance metal. The planarized dielectric material, which provides a diffusion barrier to the low resistance metal, is benzocyclobutene or a derivative thereof.

U.S. Pat. No. 6,096,648 discloses a metallization process which includes the steps of first forming a dielectric layer on the surface of a silicon layer. Next, a barrier layer is deposited on the surface of the dielectric layer, after which, a copper seed layer is deposited on the barrier layer. After the copper seed layer is deposited, the semiconductor chip is annealed to restore any crystal damage that might have occurred when the copper seed layer and the barrier layer were deposited, and to control copper film properties. After the formation of cooper lines, a low dielectric constant layer is then deposited on the surface of the semiconductor chip. The low dielectric constant layer fills the gaps between the copper lines with a non-conductive material. In one embodiment, a barrier layer is formed separating the low dielectric constant layer from the cooper layer.

U.S. Pat. No. 6,100,184 discloses a technique for fabricating a dual damascene interconnect structure on a semiconductor chip using a low dielectric constant (low-K) organic material as a dielectric layer or layers. The process disclosed in the '184 patent comprises the steps of: (a) depositing a barrier layer and a copper seed layer on the semiconductor chip; (b) annealing the semiconductor chip after the copper seed layer is deposited; (c) using microlithography to form a patterned photoresist layer on the copper seed layer; (d) electroplating a copper conductive layer on the semiconductor chip; (e) stripping off the patterned photoresist layer and portions of the barrier layer and the copper seed layer that were located beneath the patterned photoresist layer; and (f) depositing a low dielectric constant layer on the semiconductor chip.

In all the processes described above, the low-K dielectric layer was always formed after the formation of the copper interconnect. It is desirable to form the copper interconnect by first forming the low-K dielectric layer, patterning the low-K dielectric layer, and then filling in the trenches formed in the low-K dielectric layer. However, the need to form a barrier layer between the copper interconnect and the low-K dielectric layer necessitates a plasma etching process after the low-K dielectric layer is formed. It was discovered by the inventors of the present invention that the plasma etching process can materially and adversely affect the integrity of the low-K dielectric layer. This problem has resulted in lowered production yield.

SUMMARY OF THE INVENTION

The primary object of the present invention is to develop an improved for the fabrication of cooper-based semiconductors. More specifically, the primary object of the present invention is to develop a method that will improve the process for fabricating semiconductor devices which utilize copper or other low-resistivity metal as interconnects and which include a low-K (low dielectric constant) dielectric layer. A low-K dielectric layer is important in a copper-based semiconductor device to minimize the diffusion of the low resistance metal. The present invention allows the copper interconnect to be formed subsequent to the formation of the low-K dielectric layer, while preventing the low-K dielectric from being subject to a plasma etching process, which can cause the integrity of the low-K dielectric layer to be degraded. The method disclosed in the present invention is most advantageous in fabricating semiconductors using the conventional dual damascene process, where to conductive layers are separated by an inter-level dielectric (ILD) but connected by conductive vias.

The process disclosed in the present invention, which is to form a copper interconnect on a semiconductor wafer according to a predetermined pattern, can be summarized as comprising the following main steps:

(1) Forming a silica glass layer on a wafer surface;
(2) Photolithographically patterning the silica glass layer according to the predetermined copper interconnect pattern;
(3) Conformably depositing a dielectric layer on the silica glass layer;
(4) Anisotropically etching the dielectric layer to form a sidewall spacer;
(5) Depositing a low-K (low dielectric constant) dielectric layer on the wafer, covering the silica glass and the sidewall spacer;
(6) Planarizing the low-dielectric layer;
(7) Photolithographically removing the silica glass layer to form a trench in the low- dielectric layer; and
(8) Depositing a conductive material to fill the trench.

One of the key elements of the present invention is to form a pseudo-metal line from the silica glass layer mimicking copper interconnect that is to be eventually patterned. This allows the metal interconnect to be formed subsequent to the formation of the low-K dielectric layer. It also allows the dielectric side barrier (in the form of sidewall spacer) to be formed by plasma etching before the formation of the low-K dielectric layer. The former improves the precision of the metal interconnect pattern without the extra step of forming an additional dielectric layer, and the latter helps retaining the integrity of the low-K dielectric layer by eliminating a subsequent plasma etch stage, which would have been necessary if the dielectric sidewall barrier were formed after the low-K dielectric layer.

The process of the present invention is most advantageous for forming semiconductor devices wherein the conductive material is a low-resistivity metal such as copper, gold, silver, etc., or most advantageously copper. After the trench is filled with the conductive material, it is planarized by a chemical-mechanical polishing (CMP) process. Prior to the metal filling step, a thin barrier metal layer can be deposited in the trench. A silicon nitride layer can be deposited on the metal layer and the low-K dielectric layer for protection against future processes.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
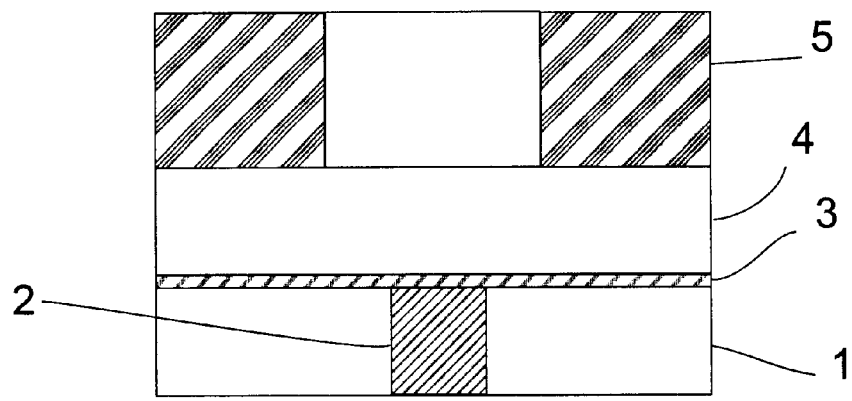
FIG. 1 is a schematic drawing showing that a photoresist is patterned on a silica glass layer, which is formed on an underlying dielectric layer containing at least a via.

The present invention discloses a method that improves the process for fabricating semiconductor devices containing copper (or other low-resistivity metal) interconnects and a low-K (low dielectric constant) dielectric layer. The low-K dielectric layer minimizes the diffusion of the low resistance metal to ensure the integrity of the copper-based semiconductor devices. The present invention allows the copper interconnect to be formed subsequent to the formation of the low-K dielectric layer, while allowing the low-K dielectric to maintain its integrity by eliminating the subsequent plasma etching process, which is necessary to form a dielectric sidewall barrier between the copper interconnect and the low-K dielectric layer. The method disclosed in the present invention is most advantageous in fabricating semiconductor devices that involve the conventional dual damascene process, where two conductive layers are separated by an inter-level dielectric (ILD) but electrically connected by conductive vias.

One of the key elements of the present invention is to form a pseudo-metal line in the place of the copper interconnect that is to be eventually patterned. After the low-K dielectric layer and the sidewall dielectric barrier are formed, the pseudo-metal line is removed and replaced with the real low-resistivity line. This allows the metal interconnect to be formed subsequent to the formation of the low-K dielectric layer, and the dielectric side barrier (in the form of sidewall spacer) to be formed by plasma etching before the formation of the low-K dielectric layer. The former improves the precision of the metal interconnect pattern without the extra step of forming an additional dielectric layer, and the latter helps retaining the integrity of the low-K dielectric layer by eliminating the plasma etch stage, which would have been necessary if the dielectric sidewall barrier had to be formed after the low-K dielectric layer.

The process of the present invention, which is part of a demarcene process to form a copper interconnect according to a predetermined pattern, can be summarized to comprise the following main steps:

(1) formimg a silica glass layer on a wafer surface, on top of a silicon nitride layer which is formed on an inter-level dielectric layer (ILD), which contains one or more vias in the form of tungsten plugs;

(2) photolithographically patterning the silica glass layer according to a predetermined copper interconnect pattern;

(3) conformably depositing a dielectric layer on the silica glass layer;

(4) anisotropically etching the dielectric layer to form a sidewall spacer on the sidewall of the silica glass layer;

(5) depositing a low-K dielectric layer on the wafer, covering the silica glass layer and the sidewall spacer, followed by planarizing the low-dielectric layer by chemical- mechanical polishing (CMP), the low-K dielectric layer can be made from fluorinated oxide modified $SiO_2$, silsesquioxane modified $SiO_2$, or a polymer such as polyimide;

(6) photolithographically removing the silica glass layer to form a corresponding trench in the low-K dielectric layer;

(7) depositing a thin metal barrier layer in the trench, followed by depositing a conductive metal layer, preferably a copper metal layer, to fill the trench, the conductive metal can be copper, gold, silver, or platinum, preferably copper.

(8) planarizing the copper layer by CMP; followed by the deposition of a silicon nitride layer to protect the low-K dielectric layer from subsequent processes.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1–12 describe the main steps of forming a copper interconnect embedded in a low-K dielectric layer according to a preferred embodiment of the present invention. These steps are described in more detail below.

FIG. 1 draws that a photoresist is patterned on a silica glass layer 4, which is formed on an underlying interdielectric layer 1 containing at least a via 2. The silica glass layer 4 has a thickness of about 1,500–4,500 Å. A silicon nitride layer 3 having a thickness of about 50–500 Å is formed between the interdielectric layer and the silica glass layer.

Figure 2:
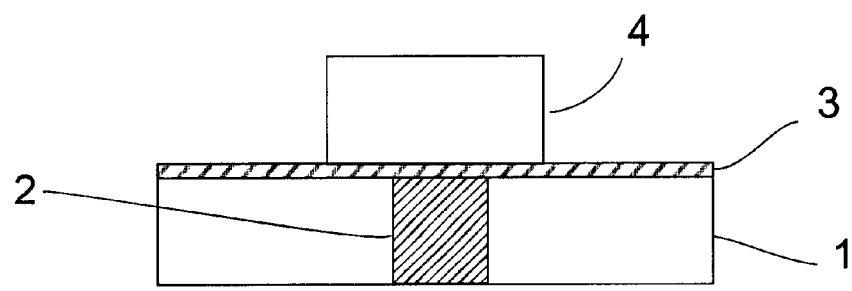
FIG. 2 is a schematic drawing showing that the silica glass layer is etched according to a predetermined pattern designed for a copper interconnect.

FIG. 2 shows that the silica glass layer 4 is photolithographically etched according to a predetermined pattern designed for the copper interconnect.

Figure 3:
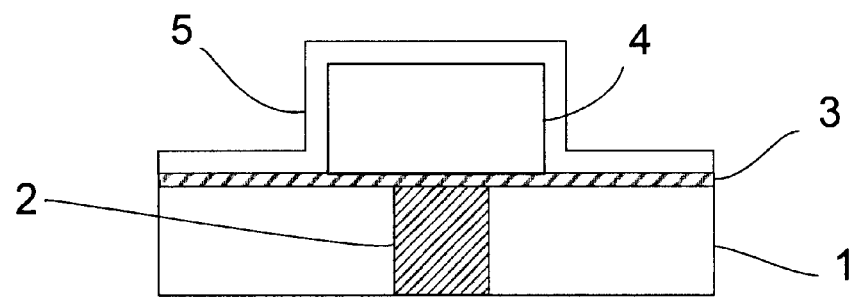
FIG. 3 is a schmatic drawing showing that a dielectric layer is conformably deposited on the wafer surface including the silica glass layer.

FIG. 3 shows that a spacer dielectric layer 5 with relatively high dielectric constant is conformably deposited on the wafer surface including the silica glass layer 4. The spacer dielectric layer 5 has a thickness of about 100–300 Å.

Figure 4:
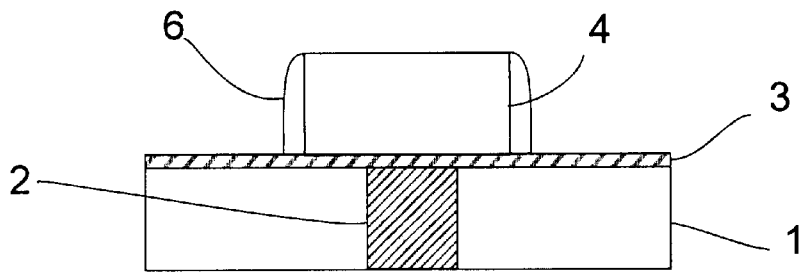
FIG. 4 is a schmatic drawing showing that a dielectric sidewall spacer is formed on the sidewall of the silica glass layer.

FIG. 4 shows that a dielectric sidewall spacer 6 is formed on the sidewall of the silica glass layer 4.

Figure 5:
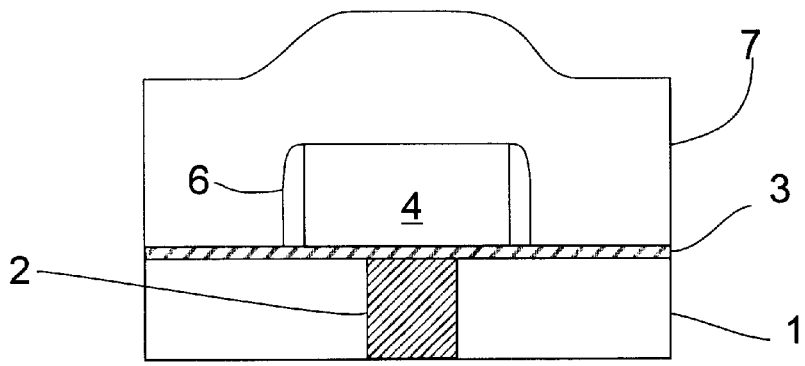
FIG. 5 is a schmatic drawing showing that a low-K dielectric layer is deposited covering the entire wafer.
Figure 6:
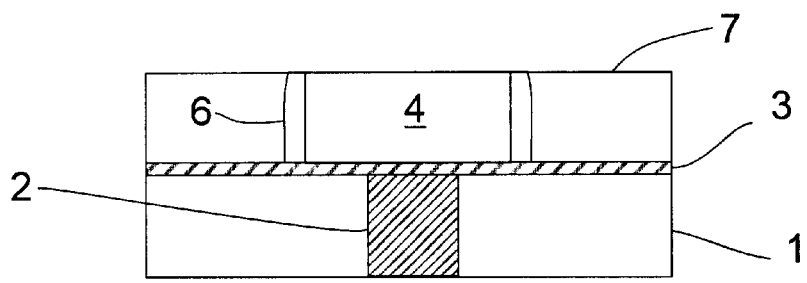
FIG. 6 is a schmatic drawing showing that the low-K dielectric layer is planarized.

FIG. 5 shows that a low-K dielectric layer 7 is deposited covering the entire wafer surface. The low-K dielectric layer 7 has a thickness of about 2,000–6,500 Å, and is subsequently planarized using chemical-mechanical polishing (CMP), as shown in FIG. 6.

Figure 7:
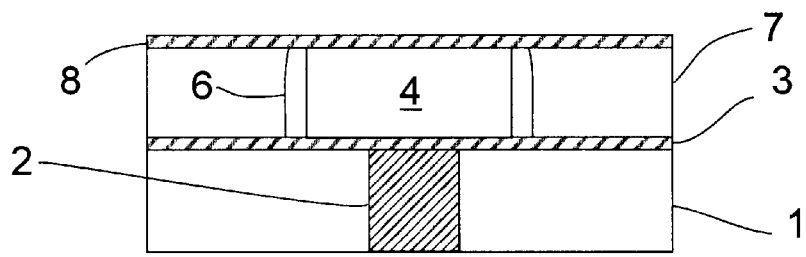
FIG. 7 is a schmatic drawing showing that a silicon nitride layer is formed on top of the low-K dielectric layer.

FIG. 7 is a schematic drawing showing that a silicon nitride layer 8 is formed on top of the low-K dielectric layer. The silicon nitride layer has a thickness of about 50–300 Å which will be serving as an etch stop in subsequent processes.

Figure 8:
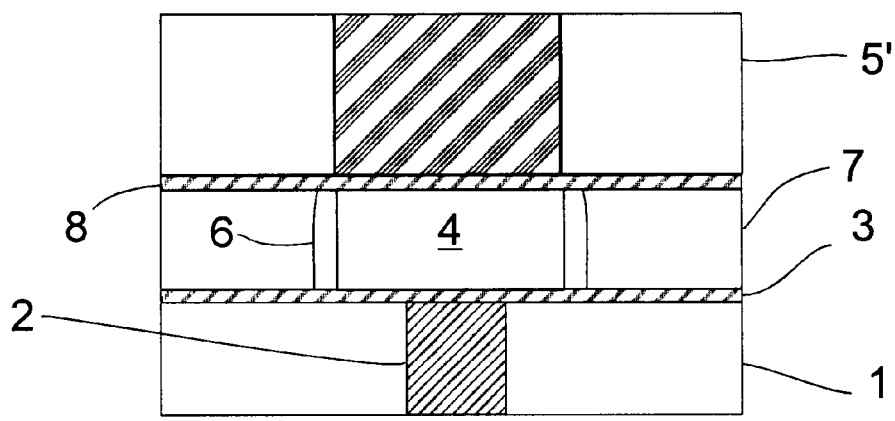
FIG. 8 is a schmatic drawing showing that a photoresist layer is formed on the wafer which is patterned to expose the silica glass layer.
Figure 9:
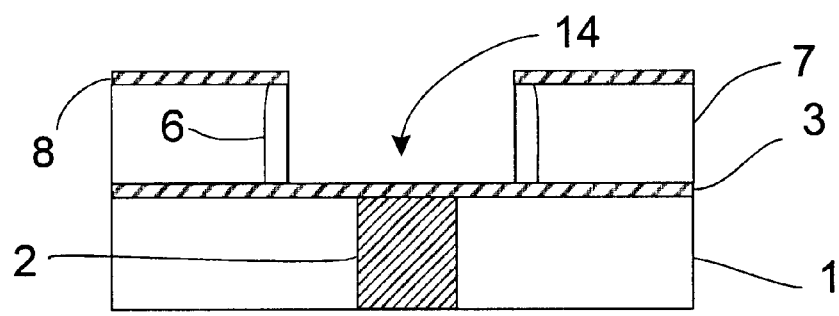
FIG. 9 is a schmatic drawing showing that the silica glass layer is removed by masked etching, followed by the removal of the photoresist layer.

FIG. 8 is a schmatic drawing showing that another photoresist layer 5' is formed on the wafer surface which is patterned to expose the silica glass layer 4. FIG. 9 is a schematic drawing showing that the silica glass layer is removed by masked etching, followed by the removal of the photoresist layer, to form a trench 12.

Figure 10:
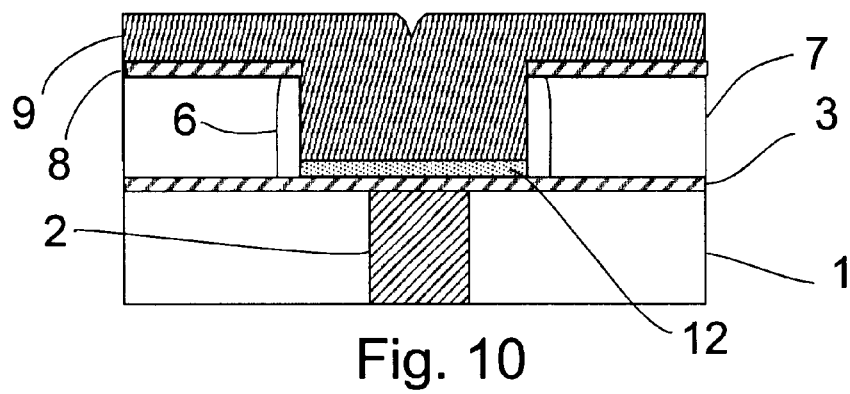
FIG. 10 is a schmatic drawing showing that a metal barrier layer and a copper layer are deposited into the trench previously filled by the silica glass layer.

FIG. 10 is a schematic drawing showing that a metal barrier layer 12 and a copper layer 9 are deposited into the trench 14 previously filled by the silica glass layer. Preferably, the metal barrier layer 12 is cobalt tungsten phosphide (CoWP) has a thickness of about 100–400 Å, and the copper layer 9 has a thickness of about 2,000–6,500 Å.

Figure 11:
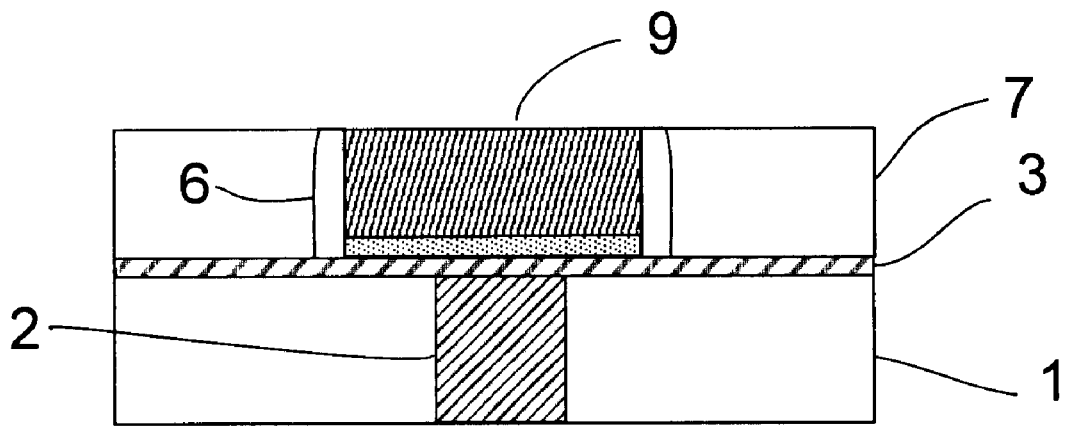
FIG. 11 is a schmaric drawing showing that the copper layer is planarized by CMP.

FIG. 11 is a schmaric drawing showing that the copper layer 9 is planarized by CMP. The CMP process stops at the silicon nitride layer shown in FIG. 10.

Figure 12:
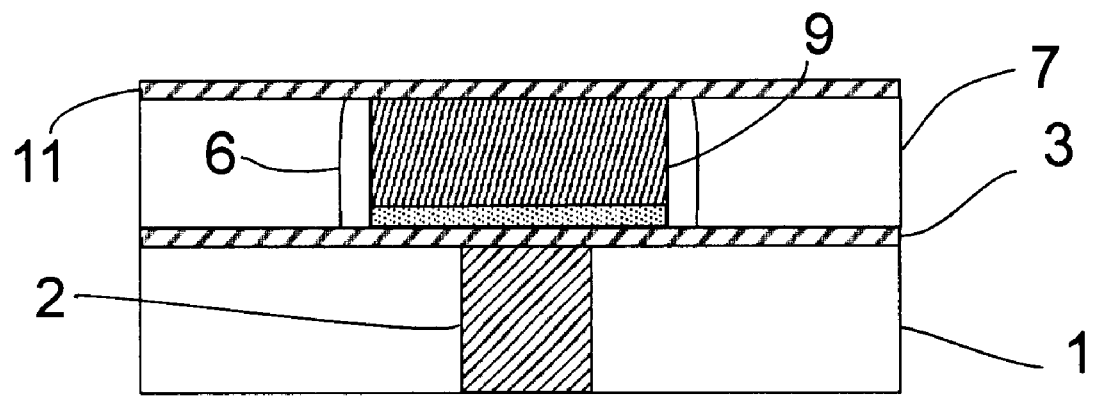
FIG. 12 is a schmatic drawing showing that a silicon nitride layer is deposited on the wafer surface to protect the low-K dielectric layer.

Finally, another silicon nitride layer 11 is deposited on the wafer surface to protect the low-K dielectric layer, as shown in FIG. 12.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for forming semiconductor devices containing a metal interconnect and a low-K (low dielectric constant) dielectric layer on a wafer, said low-K dielectric layer having a dielectric constant lower than that of $SiO_2$, and said process comprising the steps of:

(a) forming a silica glass layer on a wafer surface;

(b) photolithographically patterning said silica glass layer according to a pattern intended for a metal interconnect;

(c) conformably depositing a spacer dielectric layer on said silica glass layer;

(d) anisotropically etching said spacer dielectric layer to form a sidewall spacer on the sidewall of the silica glass layer;

(e) depositing a low-K dielectric material on said wafer to form a low-K dielectric layer, covering said silica glass layer and said sidewall spacer, followed by planarizing said low-dielectric layer by chemical-mechanical polishing (CMP);

(f) photolithographically removing said silica glass layer to form a trench in said low-K dielectric layer;

(g) depositing a conductive metal layer to fill said trench; and (h) planarizing said conductive metal layer.

2. The process for forming semiconductor devices containing a metal interconnect and a low-K dielectric layer according to claim 1, wherein said conductive metal is copper.

3. The process for forming semiconductor devices containing a metal interconnect and a low-K dielectric layer according to claim 1, wherein said conductive metal selected from the group consisting of copper, gold, silver, and platinum.

4. The process for forming semiconductor devices containing a metal interconnect and a low-K dielectric layer according to claim 1, which further comprises the step of forming a barrier metal layer in said trench prior to the step of depositing said conductive metal layer to fill said trench.

5. The process for forming semiconductor devices containing a metal interconnect and a low-K dielectric layer according to claim 4, wherein said metal barrier layer is formed with cobalt tungsten phosphide (CoWP).

6. The process for forming semiconductor devices containing a metal interconnect and a low-K dielectric layer according to claim 1, wherein said low-K dielectric material is modified $SiO_2$.

7. The process for forming semiconductor devices containing a metal interconnect and a low-K dielectric layer according to claim 1, wherein said low-K dielectric material is fluorinated oxide modified $SiO_2$ or silsesquioxane modified $SiO_2$.

8. The process for forming semiconductor devices containing a metal interconnect and a low-K dielectric layer according to claim 1, wherein said low-K dielectric material is an organic polymer.

9. The process for forming semiconductor devices containing a metal interconnect and a low-K dielectric layer according to claim 1, wherein said low-K dielectric material is a polyimide polymer.

10. The process for forming semiconductor devices containing a metal interconnect and a low-K dielectric layer according to claim 1, wherein said silica glass layer is formed on a silicon nitride layer which is in turn formed on an inter-level dielectric (ILD) layer, which contains one or more conductive vias.

11. A process for forming semiconductor devices containing a copper interconnect and a low-K (low dielectric constant) dielectric layer on a wafer, said low-K dielectric layer having a dielectric constant lower than that of $SiO_2$, and said process comprising the steps of:

(a) forming a silica glass layer on a wafer surface;

(b) photolithographically patterning said silica glass layer according to a pattern intended for a copper interconnect;

(c) conformably depositing a spacer dielectric layer on said silica glass layer;

(d) anisotropically etching said spacer dielectric layer to form a sidewall spacer on the sidewall of the silica glass layer;

(e) depositing a low-K dielectric material on said wafer to form a low-K dielectric layer, covering said silica glass layer and said sidewall spacer, followed by planarizing said low-dielectric layer by chemical-mechanical polishing (CMP);

(f) photolithographically removing said silica glass layer to form a trench in said low-K dielectric layer;

(g) depositing a copper layer to fill said trench; and (h) planarizing said copper layer.

12. The process for forming semiconductor devices containing a copper interconnect and a low-K dielectric layer according to claim 11, which further comprises the step of forming a barrier metal layer in said trench prior to the step of depositing said copper layer to fill said trench.

13. The process for forming semiconductor devices containing a copper interconnect and a low-K dielectric layer according to claim 12, wherein said barrier metal layer is formed with cobalt tungsten phosphide (CoWP).

14. The process for forming semiconductor devices containing a copper interconnect and a low-K dielectric layer according to claim 11, wherein said low-K dielectric material is modified $SiO_2$.

15. The process for forming semiconductor devices containing a copper interconnect and a low-K dielectric layer according to claim 11, wherein said low-K dielectric material is fluorinated oxide modified $SiO_2$ or silsesquioxane modified $SiO_2$.

16. The process for forming semiconductor devices containing a copper interconnect and a low-K dielectric layer according to claim 11, wherein said low-K dielectric material is an organic polymer.

17. The process for forming semiconductor devices containing a copper interconnect and a low-K dielectric layer according to claim 11, wherein said low-K dielectric material is a polyimide polymer.

18. The process for forming semiconductor devices containing a copper interconnect and a low-K dielectric layer according to claim 11, wherein said silica glass layer is formed on a silicon nitride layer which is in turn formed on an inter-level dielectric (ILD) layer, which contains one or more conductive vias.

* * * * *